United States Patent [19]
Flamme et al.

[11] Patent Number: 5,735,411
[45] Date of Patent: Apr. 7, 1998

[54] CONSTRUCTIONAL SYSTEM

[75] Inventors: Hans Flamme, Unterhaching; Peter Simon, München; Gerd Rheindt, Haar, all of Germany

[73] Assignee: Knürr-Mechanik für die Elektronik Aktiengesellschaft, München, Germany

[21] Appl. No.: 600,266

[22] Filed: Feb. 9, 1996

[30] Foreign Application Priority Data

Feb. 14, 1995 [DE] Germany ............... 295 02 404.6
May 2, 1995 [DE] Germany ............... 195 15 934.9

[51] Int. Cl.⁶ .................................................. A47F 7/00
[52] U.S. Cl. .................... 211/26; 211/153; 211/192; 211/10; 211/191; 108/180; 312/223.1; 361/829
[58] Field of Search ................ 211/26, 189; 361/688, 361/724, 829, 831; 312/223.1; 108/158, 180

[56] References Cited

U.S. PATENT DOCUMENTS

| | | | |
|---|---|---|---|
| 2,091,549 | 8/1937 | Kelso | 361/724 X |
| 3,360,321 | 12/1967 | Novales | 211/153 X |
| 3,807,572 | 4/1974 | Luvara et al. | 211/10 |
| 4,148,263 | 4/1979 | Suttles | 211/153 X |
| 4,265,500 | 5/1981 | Berton et al. | 211/192 X |
| 4,602,829 | 7/1986 | De Andrea | 312/223.1 |
| 4,646,656 | 3/1987 | Marschak | 108/180 X |
| 5,031,070 | 7/1991 | Hsu | 361/829 X |
| 5,508,890 | 4/1996 | Hirata | 361/829 |
| 5,584,406 | 12/1996 | Besserer et al. | 211/191 X |
| 5,593,219 | 1/1997 | Ho | 361/724 X |

FOREIGN PATENT DOCUMENTS 2689328 10/1993 France ............... 312/223.1

Primary Examiner—Alvin C. Chin-Shue
Assistant Examiner—Long Dinh Phan
Attorney, Agent, or Firm—Evenson, McKeown, Edwards & Lenahan, PLLC

[57] ABSTRACT

The invention relates to a constructional system for frames, racks and casings and in particular for sub-racks and equipment cabinets for accommodation of electrical and electronic assemblies, units and printed circuit boards.

At least one joint system having engagements is provided for thread-forming screws as fastening elements for particularly cost-effective manufacture of such type of constructional systems, and for simple assembly as well as for ensuring effective EMC screening in accordance with the invention between horizontally and vertically arranged components, in particular between side parts and a top part and a base part having multi-folded horizontal struts and/or vertical struts. Lug joints as second joint zones are preferably provided as an addition to the first joint system having joint zones accessible from the end faces and, third joint zones, for example, for sub-racks or equipment cabinets and which enable, for example, a fixing of printed circuit boards and the like by means of formed, threaded holes.

24 Claims, 4 Drawing Sheets

CONSTRUCTIONAL SYSTEM

BACKGROUND OF THE INVENTION

1. Field of the Invention

The invention relates to a constructional system for frames, racks and casings, especially for sub-racks and cabinets, for example, for equipment cabinets for housing electrical and electronic assemblies, units and printed circuit boards.

2. Description of Related Art

Constructions of frames, racks, casings, sub-racks and cabinets feature vertically and horizontally arranged components, which are normally cut-to-length profile struts, interconnected in connecting joint zones, especially in corner regions. Cabinet constructions are known in which vertical struts, horizontal struts and cross struts are joined together by corner connectors.

To manufacture casings or cabinets, frame constructions of this type can be provided with panel sections. For example, at least side sections and intermediate shelves are fitted to frames, and to equipment cabinets a base section and top section too, plus a rear panel or a rear end door and a front facia. Sub-racks or modular chassis normally feature an opening in the front elevation for accommodating printed circuit boards and their facia panels.

These constructions have to satisfy a series of requirements. In particular, suitable mechanical strength must be assured to meet the field of application in question. In addition, the IP (international protection) standard on sealing of enclosures and EMC (electromagnetic compatibility) screening should, if so required, be attainable for equipment cabinets by the simplest and most effective means possible.

Conventional frames, racks, casings and cabinets only meet these requirements to a limited degree and only with the aid of complex and expensive constructions using a multiplicity of individual components and various materials and methods of joining.

Consequently, in the case of sub-racks for example, it requires the provision of a standardized manufacture of threads in the front horizontal struts, which, due to the quantity, involves considerable effort in manufacture and adversely affects production costs. For sealing enclosures effectively and, in particular, for HF screening, additional technological measures and procedures are required, for example, surface treatments.

SUMMARY OF THE INVENTION

The object of the invention is to create an extremely simple, cost effective constructional system, which can be used universally and provides for the system to be expanded both in the manufacturing of frames and racks, as well as for casings and sub-racks or modular chassis, and being especially suitable for equipment cabinets.

The constructional system in accordance with the invention is based on a design for connection or attachment of horizontally and vertically arranged components and provides for cost-effective manufacture of a frame, a rack, a casing or a cabinet, especially an equipment cabinet.

The constructional system according to the invention features components having defined joint zones. According to the invention, components, especially horizontally or vertically arranged components, are provided with engagements or indentations, in which a connecting element, which is used for attaching a second vertically or horizontally arranged component, can be fixed by way of a self-locking or self-cutting operation.

The engagements or indentations, which represent joint zones as formed or swaged screw channels for a fastening element, more especially for a thread-forming screw, are formed in a particularly advantageous manner for facilitating engineering production, involving minimal effort by employing a multi-bending or press braking operation on flat material.

As a result, there is the possibility for the constructional system as provided for by the invention to produce the defined made-to-measure section from flat material, which offers considerable advantages in the manufacture, assembly, use and, in particular, its disposal.

Advantageously, the engagements are formed diametrally to the longitudinal axis of a multi-bent, strut-like component, formed from a made-to-measure section. In a receiving channel, formed by folds of a made-to-measure section, an interlocking fixation of a thread-forming screw, introduced into an end face, is possible by means of two (preferably spaced apart) engagements, thus ensuring a positive, non-slipping and earthquake resistant fixing of at least one other component.

Vertically, crosswise and horizontally arranged struts, formed by folds of a metal sheet and provided with joint zones comprising interlocking locations (i.e. engagements), can be connected together to construct a frame.

It is particularly beneficial if the engagements of the joint zones are provided on the horizontal struts, which are integrated in top and base sections and/or in intermediate shelves. Such components having multi-bent or folded horizontal struts can be attached to vertical struts to construct, for example, a rack or a sub-rack.

Likewise, vertical struts or components having integrated vertical struts, equipped with such engagements, can be provided for the formation of end face accessible screw channels, formed as joint zones. To achieve a particularly stable joint between a horizontally arranged component, for example, a base section or top section and vertical struts having engagements, it is expedient to swage in at least two engagements, arranged in each case one above the other within the zones of the edges of a vertical strut, especially within the internal edge zones of a vertical strut. To attach a top section or base section, or to attach an intermediate shelf, two thread-forming screws, for example, self-tapping screws, can then be introduced for each vertical strut and joint, and be anchored in a particularly efficient thread-forming manner.

Advantageously, made-to-measure sections produced from flat material are subjected to a bending process at defined zones and provided with integrated front face and rear face horizontal or vertical struts, quadratic or rectangular in cross section.

The engagements (i.e. swaged locations) at least are formed in the end face near the ends of the struts integrated in the horizontal or vertical components and preferably in at least one edge zone facing an inner cavity/chamber.

In order to ensure positive securement of a fastening element, for example of a thread-forming screw, indentations, in particular quadratic or rectangular indentations, can be swaged/formed in the edging zones of horizontal or vertical struts. These do not only ensure non-slipping and earthquake resistant anchorage of the screws and thus a long-lasting stable securement of the components to be joined, for example, the joining of a vertical strut and a top section or base section, but ensure good earthing of the constructional arrangement too.

Another advantage is a possible self-adjustment of the joint element, which is due to the design of the engagement of the joint elements.

Since it involves a releasable/detachable joint and the use of standard, ready available tools for manipulation of the thread-forming screw, an efficient assembly of the constructional arrangement as provided by the invention is possible.

The use of standard, uniform flat material for the horizontally and vertically arranged constructional parts to be united provide a particular advantage in the manufacture of casings, sub-racks and equipment cabinets. Furthermore, in addition to the top sections and base sections and/or intermediate shelves, side sections can be manufactured, as vertical components, and in particular, those with integrated vertical struts made from made-tomeasure section and preferably from identical material, and furthermore, be produced with an additional second joint zone for a lug joint, providing further advantages in the fixing and joining of components, and more especially in respect of effective EMC screening.

Lug joints require the provision of lug locations and complementarily designed engagement lugs, wherein the locations are formed preferably on/in horizontal components, for example, on/in a base section and on/in a top section of an equipment cabinet or a sub-rack, and the engagement lugs are formed preferably on the upper and lower edging zones of vertically arranged side sections. There is also the possibility of providing locations designed as swaged out locations on the side sections and engagement lugs on the base section and top section. For example, it is advantageous in the fixing of a rear panel to provide the engagement lugs on the rear panel, wherein these lugs are preferably formed on 90x folded edging zones and can engage in locations of adjacent panel parts, especially of double ended side sections.

The lug joints ensure an initial securement of the components, preferably having self-adjustment, and providing a comb-like interlocking unification, which affords particularly effective EMC screening. For this purpose, contacts are provided on the lugs of the comb-like interlocking lug joints, as, for example, spot-like embossments, which upon insertion of the engagement lugs into the locations, scrape material away from inside the locations. For particularly efficient EMC screening, it is expedient to produce the contacts alternately, that means on the inner face and on the outer face of the engagement lugs.

Advantageous for cost-effective production of the constructional systems is the possibility of premanufacturing the elements of the lug joints in a made-to-measure flat material section. The formation of the contact elements, which can also be formed to serve as interlock elements of the lug joints, formed out of folded edges (especially side edges on the horizontal top sections and base sections facing each other) and the formation of finger-like engagement elements on the side sections can be produced in a stamping and embossing operation.

To increase the stability of the components, additional bracings or reinforcement beads, for example, in the corner zone of folded side edges on top sections and base sections can be formed. To form lug joints as tightly fitting as possible, cutouts, for example, stamped out material in the adjacent edging zone of the side sections, are provided in the region of the pre-manufactured bracings.

Improved mechanical strength of the side sections can also be achieved by embossments and beads having a defined form and arrangement.

It is advantageous to secure the material during bending and folding by means of clinching or by means of the TOX method of clinching. In the case of sub-racks or modular chassis, the accomplishment of a particularly stable design, for example, by providing a doubling of the front face edging zone of a horizontal component within the engagement zone of lugs and tensional supports for printed circuit boards is recommended. The horizontal struts, formed by the multiple reciprocal bending or folding of a made-to-measure flat material section, are advantageously provided to form a receiving cavity, back and fourth from the front opening.

In another embodiment of the invention the horizontal struts at least feature a third arrangement of joint zones, which are formed as threaded holes in the made-to-measure flat material section, having a single encircling and swaged formation of material, producing a maximum of one full formed thread, and fabricated, in particular, in a comb-like interlocking manner and in a quantity which corresponds to a standard. A thread-forming screw can be secured in each threaded hole, for example, for the fixing of printed circuit boards at the front facia panel side. Pre-manufacture of the threaded hole in the made-to-measure section is advantageous, whereby considerable cost savings are made in the manufacture of components, especially vertical and horizontal struts, having a plurality of such threaded holes.

In a preferred embodiment of the invention, the constructional system features a rear panel, which can be joined to the side sections and the top section and the base section to produce an EMC screen. In a similar manner to that of the side sections, the rear panel, made from a single flat piece of material, is formed by bends or folds and by stamped out material, plus, if need be, embossments, and features edging zones, which represent finger-like engagement elements, which are accepted in a comb-like interlocking manner into corresponding locations of adjacent panel sections, in particular, side sections. EMC screening is achieved, more especially by way of contact elements on the engagement elements, which work together in association with the locations.

In addition to this self-centering joint of the rear panel and the adjacent panel sections, the rear panel is, in yet a further embodiment, to be secured by means of locking devices. These locking devices are preferably provided close to the side sections and, for example, in an upper and lower zone of the rear panel, and at least feature one lokking latch or a locking hook, especially on the rear panel, and a latch catch working in conjunction with the locking latch or the locking hook, especially on the adjacent side section.

A preferred locking device features a locking plate guided on the inner face of the rear panel having two locking latches facing the adjacent side panel. The locking plate is guided by a pin having a gripping element in a cutout of the rear panel, and can be moved from an unlocked position through a line of movement, for example in a bolt guide, into a locked position. In a simple design arrangement, a cutout, made in the rear panel, is suitable as a bolt guide. When using knurled screws as bolt retainers, it is advantageous that holding elements be provided at the same time, which can be used during assembling and dismantling of the rear panel. Positive locking is accomplished by hook-like locking latches or by a right angled cutout, in which the knurled screw or a bolt with a holding element can be guided horizontally and then vertically downwards.

The latch catches are formed complementarily to the locking latches or locking hooks or similar locking elements of the locking plate and are form preferably in vertical struts of the side sections, for example, as slot-like cutouts. In a particular advantageous embodiment, the latch catches can also be formed directly in the side section faces. Basically, the locking devices for securing the rear panel can also be used to secure the top section and/or the base section.

The constructional system in accordance with the invention is particularly advantageous, due to possible use of standard flat material, for example, CrNi steel, and the premanufacture of stamped-out material, embossments and the like in the manufacture, assembly and the prevalence of a multiplicity of variants. The use of standard material, having particularly good corrosive (resistant) and screening properties, plus the small transition faces between the components due to the small number of components, provide good EMC properties for the constructional arrangements.

Fundamental benefits are gained from using standard, uniform material and from adopting methods of processing through the means of bending, through the TOX method of clinching and through standard clinching operations for the disposal of frames, racks, casings, sub-racks or cabinets. Dismantlement, for the purpose of sorting and grading of various materials, can thus be obviated. Characterization and simple grading of the material simplifies processing and recycling, and results in achieving very low processing costs.

In one embodiment of the invention a "black box" is provided as a case-like mounting or attachment to or on casings and sub-racks for the location of additional components, for example, non-standard assemblies, switches, plugs and the like.

BRIEF DESCRIPTION OF THE DRAWINGS

The invention is explained in more detail in the following with the aid of schematic drawings.

DESCRIPTION OF A PREFERRED EMBODIMENT

Figure 1:
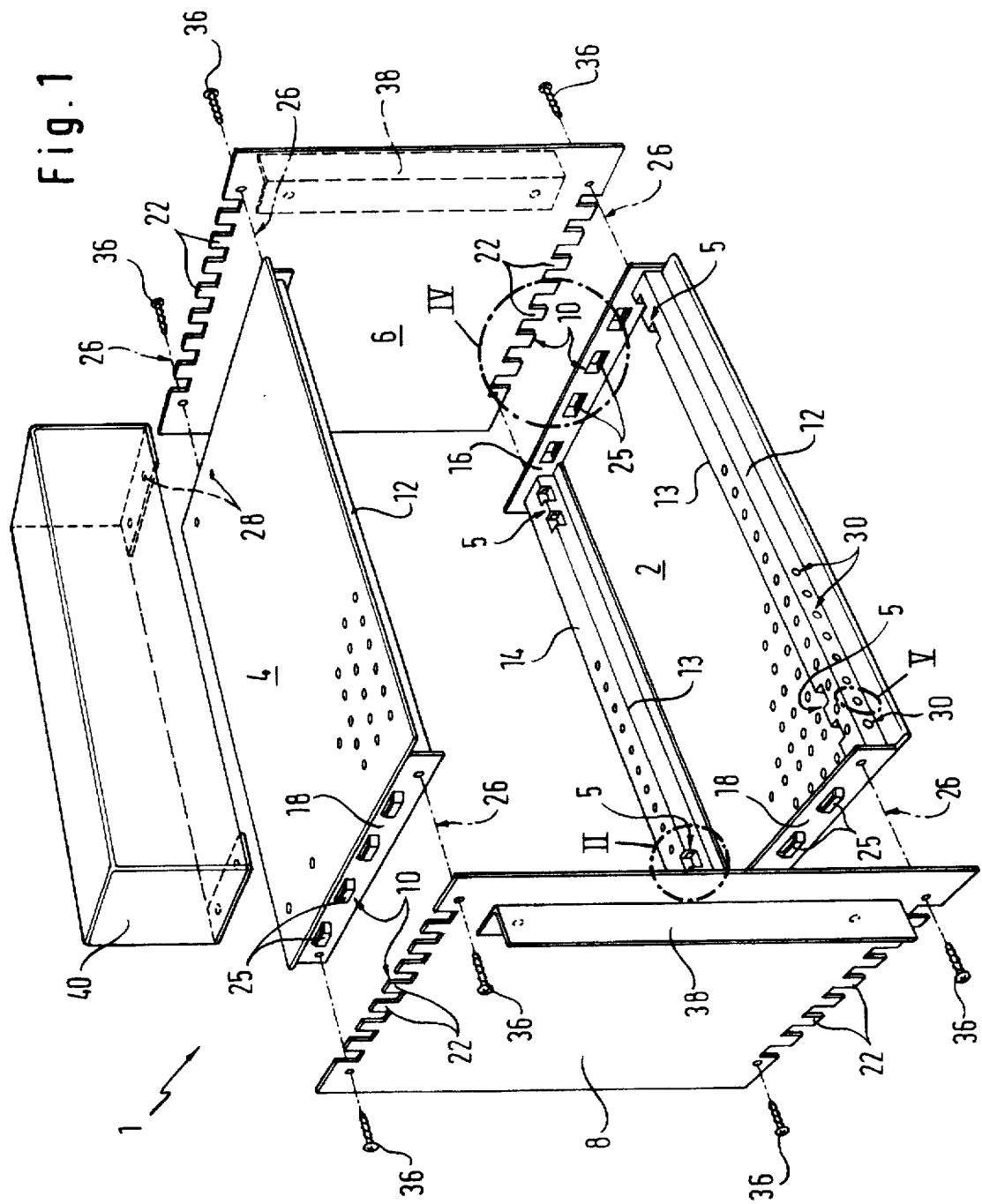
FIG. 1 is an exploded perspective view of a sub-rack or a modular chassis formed in accordance with the invention.

In FIG. 1 is depicted a sub-rack 1 in exploded presentation as a first design variant of a constructional arrangement in accordance with the invention.

The sub-rack 1 features a base section 2 arranged horizontally and a top section 4, the front face horizontal strut 12 and rear face horizontal strut 14 of which are incorporated in an integral form. The base section 2 and the top section 4, as well as the horizontal struts 12, 14 integrated therein, are manufactured from a made-to-measure section from flat material, preferably from chrome-nickel steel sheeting. The horizontal struts are formed by multi-bending operations (in this example—by 180° and 90° folds) and secured at an internal edging zone by embossed or clinched unification 11.

Figure 3:
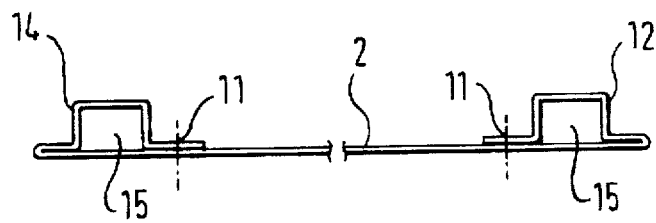
FIG. 3 is a schematic illustration of a horizontally arranged component having integrated horizontal struts.

In FIG. 3 is depicted, in very simple schematic presentation, a base section 2 having integrated horizontal struts 12, 14, wherein the horizontal struts 12, 14 are formed by multi-bending or folding operations and secured by clinch unification 11 on an inner face folded flange.

The horizontal struts 12, 14 feature in this design example a rectangular cross section, and define a location channel 15 for end face fastening elements 36. With the aid of the fastening elements 36, which unite the first arrangement of joint zones 5 of the integrated horizontal struts 12, 14, side sections 6, 8, as panel parts of the sub-rack 1, can be united with the base section 2 and the top section 4.

Figure 2:
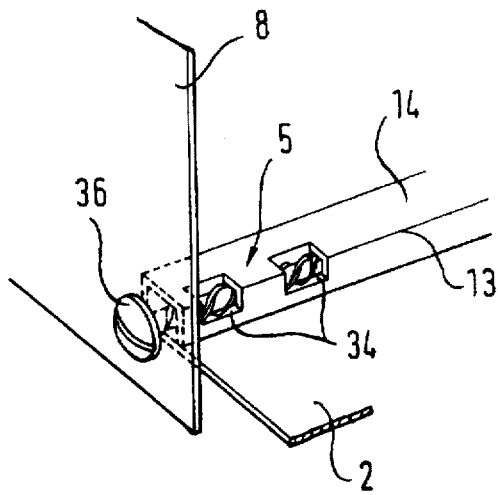
FIG. 2 is an enlarged perspective view of the first arrangement of joint zones having engagements in portion II of FIG. 1.

The design of the first arrangement of joint zones 5 is represented pictorially by Section II in FIG. 2. The first arrangement of joint zones 5 are formed as engagements or indentations 34, applied at right angles or diametrally to the longitudinal axis of the integrated horizontal struts 12, 14. The folded horizontal struts 12, 14 and, more especially, the right angled engagements 34 near the end face zones of the horizontal struts 12, 14 ensure a positive, long-lasting stable fixation and a non-slipping and earthquake resistant anchorage of thread-forming screws 36. Such thread-forming screws 36, which are used beneficially as fastening elements of the first arrangement of joint zones 5, are held by the indentations 34, ensuring a positive securement of a side section 6, 8 and a top section 4 and a base section 2 or a similar horizontally arranged component.

Such a type of construction of assembly is also possible for horizontal struts and vertical struts or cross struts. This method of assembly is particularly advantageous for components having integrated struts and indentations formed therein. As can be seen in FIG. 1, a sub-rack, a casing or an equipment cabinet can be manufactured in this manner using a minimal number of components. It is particularly advantageous to use a material which, in each case, as a single piece flat material, can be subjected to bending, stamping and/or embossing processes. This results in achieving very rapid processing times, significantly lower logistic costs resulting from a reduced quantity of parts and better purchase conditions, plus in particular, quicker assembly.

Quicker assembly is not only provided by the first arrangement of joint zones 5, but, more especially, by a second arrangement of joint zones in the manufacturing of sub-racks, casings and equipment cabinets. This second arrangement of joint zones 10 involves lug joints, which as locations 25 and as engagement elements 22 are, in particular, formed in a comb-like manner and work in conjunction with each other.

The lug joints enable pre-fixing to be effected and, in the case of a suitable design, self-adjusting fixation of the side sections 6, 8 to the base section 2 and to the top section 4, plus a rear panel 7 to the side sections 6, 8 and/or to the base section 2 and/or to the top section 4.

Figure 4:
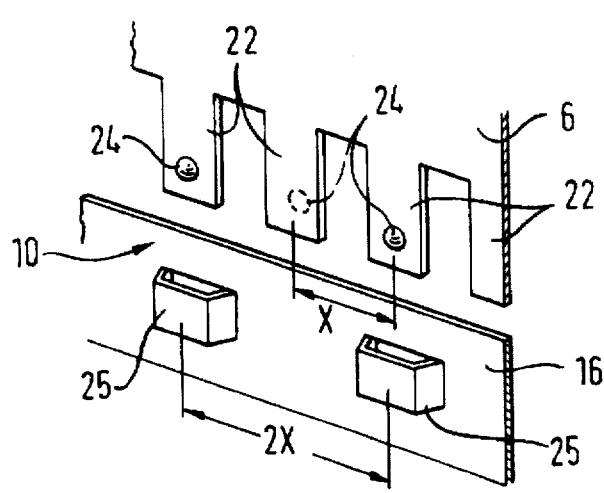
FIG. 4 is an enlarged perspective view of lug joints formed as a second arrangement of joint zones in portion IV of FIG. 1.

A preferred embodiment is depicted in FIG. 4 in an enlarged presentation of Section IV as per FIG. 1. The locations 25 are on right angled formed side edges 16, 18 of the base section 2 and the top section 4 and accept finger-like formed engagement elements 22, which are formed on a top and bottom edging zone of the side sections 6, 8, for example, by castellated stamped out material. In order to ensure EMC screening, contact elements 24 are formed, particularly on the finger-like engagement elements 22, which upon insertion into the locations 25 result in material being scraped away. It is expedient to design the finger-like engagement elements 22 correspondingly longer to accommodate the arrangement of raised spot-like contact elements 24, such that these can act simultaneously as interlocking elements of the comb-interlocked panel sections 2, 4, 6, 8.

Advantageously, the screw fixings 26 of the first arrangement of joint zones 5, and also the lug joints 10 of the second arrangement of joint zones are formed in the direction of the receiving cavity of sub-rack 1, so that in general the external aesthetics is not adversely affected. It can be deduced from the pictorial presentation of the second arrangement of joint zones 10 in FIG. 4 and in FIG. 11 that both the engagement elements 22 and the locations 25 can be formed in a comb-like interlocking manner. A comb of engagement elements 22 in a ratio of 2:1 to the location 25 and alternate formation of spot-like embossed contact elements 24 as swaged deformations on the inner or outer faces of the engagement elements 22 provide a particularly effective EMC screen.

After producing the lug joints, the screw fixings 26 are produced. It is expedient if "L" shaped and vertically arranged fixing flanges 38 are fitted vertically to the external faces of the side sections 6, 8 and simultaneously secured by the screw fixings 26. The top section 4 and the base section 2, in this example, are formed as a perforated sheet.

Figure 5:
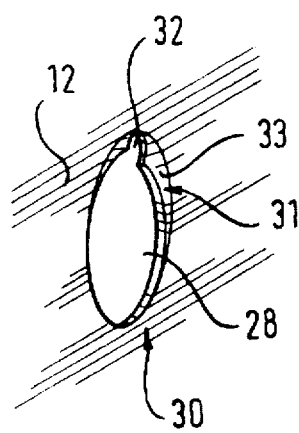
FIG. 5 is an enlarged perspective view of a formed single thread in portion V of FIG. 1.

In using the constructional arrangement in accordance with the invention as a sub-rack, as a casing or as an equipment cabinet, it is recommended to produce a third arrangement of joint zones 30 in the horizontal struts 12, 14, such that a front facia attachment of inserted printed circuit boards is possible (FIG. 5).

In contrast to the state-of-the-art technology, the joint zones 30, to be manufactured in large quantities, are formed as swaged threads 28 in the integrated front horizontal strut 12, so that expensive manufacture of threads produced in the conventional manner can be obviated. As a result, there is a considerable reduction in manufacturing effort and expenditure.

A swaged or otherwise formed thread 28 of this type is formed as an almost circular orifice and features a formation 33 of a half to one full thread as a thread start zone for a thread-forming screw. As a partial thread 28, the formation 33 surrounds a sickle-like zone 31 and a cutout 32, wherein at least the sickle-like zone 31 projects into the orifice and is bent outwards or inwards.

Advantages of the formed threads are the facility for premanufacture and a positive securement and anchorage of the threaded screws (refer to FIG. 5). Such a third arrangement of joint zones 30 is, therefore, also advantageous for racks, casings and equipment cabinets and can be provided in vertical struts and/or horizontal struts.

Figure 6:
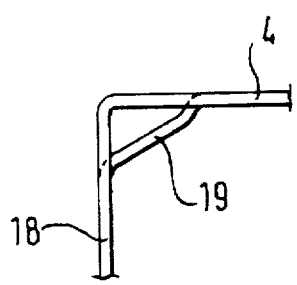
FIG. 6 is a schematic illustration of a side edge formation of a horizontal component.

Another advantageous embodiment is a cross bracing 19, depicted schematically in FIG. 6. Such types of cross bracings 19 impart additional stiffening of the side edges 16, 18, which are formed at right angles and facing each other on the base section 2 or on the top section 4. The adjacent edge zones of the side sections 6, 8 are provided with complementary cutouts, in order to ensure particularly well sealed and effective EMC screening. These cross bracings increase, in particular, the stability and strength for equipment cabinets, racks or casings.

FIGS. 7 to 11 depict in partial pictorial presentations an equipment cabinet as another variant of a constructional system in accordance with the invention.

Figure 7:
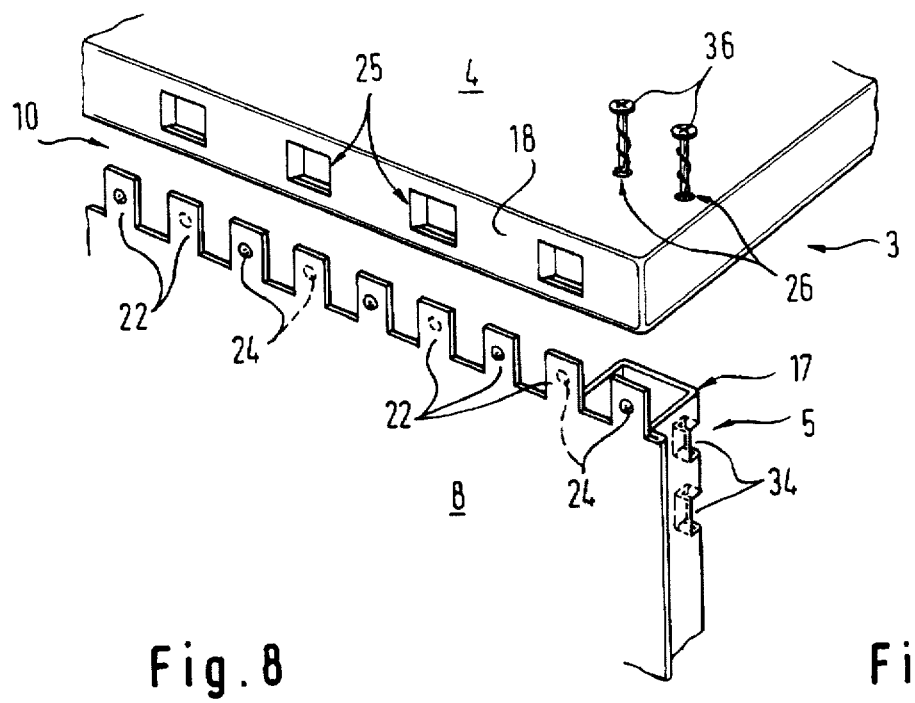
FIG. 7 is an exploded perspective view of an equipment cabinet formed according to the invention in a perspective Scrap View.

An equipment cabinet 3 is depicted in FIG. 7 in partial, perspective presentation in the zone of a vertical side section 8 and a top section 4.

In an advantageous manner, suitable for technical manufacture and assembly, is designed the first arrangement of joint zones 5 in the form of engagements 34 in vertical struts 17, and the second arrangement of joint zones 10 having engagement elements 22 on the side section 8 and locations 25 on side edges 18 of the top section 4. The engagement elements 22 are designed complementarily to the locations 25 and ensure a sealed (close fitting) joint. Spot-like embossed contact elements 24, which are formed alternatively on internal and external faces of the engagement elements 22, ensure good EMC screening.

The panel sections 4, 8, pre-fixable by means of the lug joints 10, are interlocked together by screw fixings 26 arranged in corner zones. For this purpose, engagements 34 or indentations, as the first arrangement of joint zones 5, formed in the edging zones facing the inner chamber, are formed in the vertical struts 17 (refer also to FIGS. 9 and 10), which are produced by bends and folds of a single made-to-measure sheet metal section. In this example, two self-locking thread-forming screws 36 are introduced into and secured in these indent-formed screw channels for securing the top section 4 in a corner zone.

Figure 8:
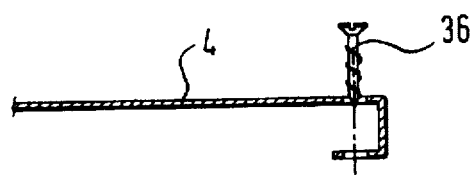
FIG. 8 is a partial vertical view of a top section of an equipment cabinet according to FIG. 7, but having a thread-forming screw for the securement of the screw.
Figure 10:
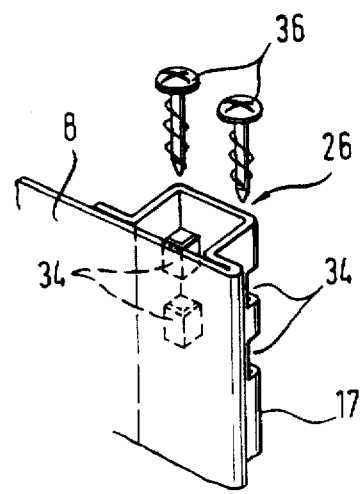
FIG. 10 is a partial perspective view of a part of a vertical strut of a side section of an equipment cabinet according to FIGS. 7 and 9.
Figure 9:
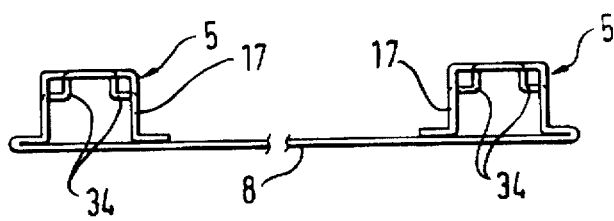
FIG. 9 is a horizontal sectional view of a side section of an equipment cabinet according to FIG. 7 having vertical struts and engagements.

FIG. 8 shows a possible arrangement of a top section 4. This top section 4 is also formed from a made-to-measure section by folds. Whilst the top section 4 of FIG. 7 is fixed in the corner zones by means of two thread-forming screws 36, only one thread-forming screw 36 for each screw joint 26 for the top section 4 of FIG. 8 is provided.

Figure 11:
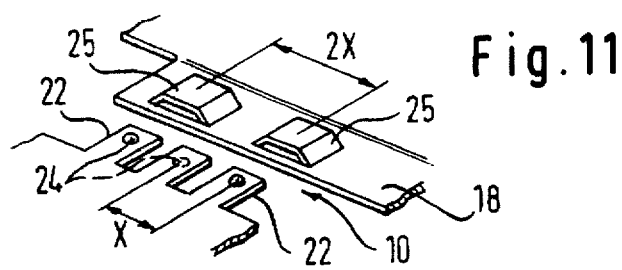
FIG. 11 is a partial perspective view of panel sections of an equipment cabinet having a horizontally aligned lug joint.

FIG. 11 depicts a horizontally aligned lug joint 10, which, for example, can be formed in accordance with FIG. 1 for manufacturing a "black box" 40 or similar casing. Locations 25 and engagement elements 22 having embossed contacts 24 are formed on horizontally folded edging zones of corresponding components and engage in each other in a sealed, interlocking manner. An additional seal can be provided in the region of the lug joints 10, in order to attain a good seal to meet IP (international protection) standards on sealed enclosures. Effective EMC screening is achieved by means of the embossed contacts 24, ensuring effective contact of the panel sections in the locations 25 and in the interposing edging zones 18.

Figure 12:
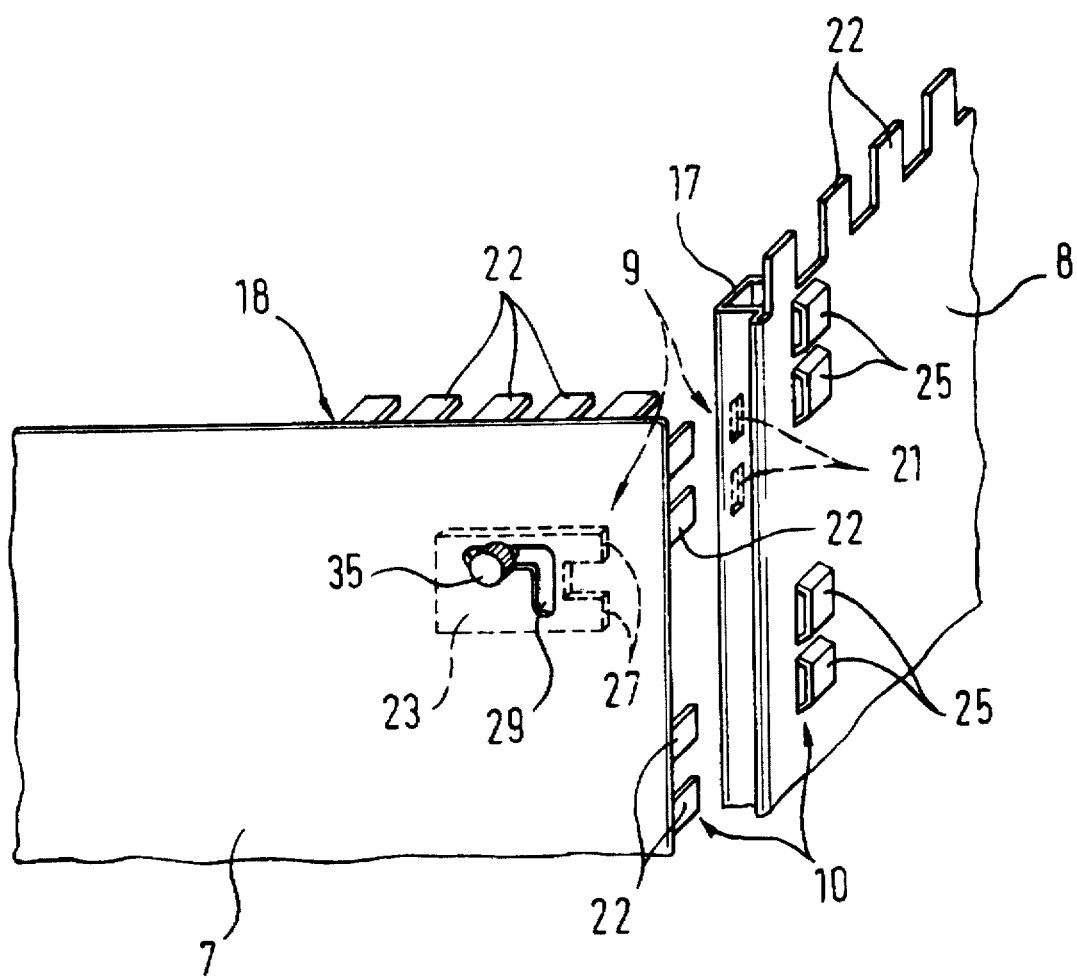
FIG. 12 is a schematic perspective illustration of a rear panel in an upper zone having a locking device.

A rear panel 7 and a side section 8 of an equipment cabinet are shown in FIG. 12 in a scrap sectional presentation having a locking device 9. On the rear panel 7 are formed engagement elements 22 in an approximately 90° folded flange, which in combination with the locations 25 are self-adjusting, which as the second arrangement of joint zones, are only depicted on the side section illustrated. Embossed contacts (not depicted) can be formed on the engagement elements 22 and/or in the cavity of the locations 25, in order to attain effective EMC screening in this casing or cabinet zone.

The locking device 9 features locking latches 27 on a movable locking plate 23 arranged on the internal face. The locking plate 23 is at least movable horizontally by means of a bolt retainer 35 guided outwards, which features a pin and a gripping element and can, for example, be designed as a knurled screw. Due to horizontal movement, the locking latches 27, formed in this example as a rectangle, engage with lock catches 21 on the adjacent side section 8.

If the locking latches 27 are formed hook-shaped or bent over at an angle, a particularly positive locking effect is achieved. This is improved even further if a bolt guide or cutout 29, set at approximately right angles, is provided. The possibility of securement during assembly and disassembly of a rear panel 7 by using the knurled screws or bolt retainers 35, operable from outside, is particularly advantageous.

We claim:

1. A constructional system for equipment cabinets for accommodating electrical and electronic assemblies, units and printed circuit boards having vertically and horizontally arranged components comprising:

joint zones for connecting the components to each other including first joint zones designed in any of horizontal struts, cross struts and vertical struts, said struts being formed by a flat material including multiple bends or folds, the first joint zones being formed as end face location channels in said struts, thread-forming screws for fixing of said vertically and horizontally arranged components at said struts, and engagements or indentations formed by one of a cutting tool and a punching machine diametrically to the longitudinal axes of said struts in at least one edge zone of said end face location channels.

2. A constructional system as claimed in claim 1, wherein said struts are integrated with said first joint zones accessible from end faces for screw fixing in panel parts of any of a rack, a casing, a sub-rack and an equipment cabinet.

3. A constructional system as claimed in claim 2, wherein the horizontal struts are integrated as panel parts which can be fixed to any of the cross struts, the vertical struts and side parts by screw connections.

4. A constructional system as claimed in claim 2, wherein the vertical struts are integrated in side parts as panel parts and wherein a top part and a base part can be fixed as panel parts by screw connections so that, for equipment cabinets, at least two screws are provided at each screw connection of a vertical strut.

5. A constructional system as claimed in claim 4, wherein the top part and the base part are provided with side edges and the horizontal struts or the vertical struts feature the first joint zones for an interlocking screw fixing, and further comprising second joint zones provided near the side parts and on the side edges.

6. A constructional system as claimed in claim 5, wherein the second joint zones are provided as lug joints for attaching the side parts to the top part or the base part and/or for attaching a rear wall to the side parts and/or to the top part and/or base part and are designed as a self-centering joint.

7. A constructional system as claimed in claim 6, wherein the top part, the base part, the rear wall and the side parts are formed in each case from a single piece flat material by bending edges, folding edges, multibends, stamped out material and embossments and are provided with the first joint zones and/or the second joint zones.

8. A constructional system as claimed in claim 6, wherein a self-supporting casing, a sub-rack or an equipment cabinet is formed by the top part and the base part and the side parts, which are connected by lug joints and by screw connections in the region of the horizontal struts and/or the vertical struts, whereby locking devices are provided on the rear wall additional to the lug joints for securing the rear wall to the side parts and/or to the top part and/or to the base part.

9. A constructional system as claimed in claim 6, wherein the lug joints have locations and complementarily designed engagement elements, which are, in particular, designed in a comb-like interlocking manner.

10. A constructional system as claimed in claim 9, wherein the locations are formed in the side edges of the base part and the top part and the engagement elements in the side parts are formed for joining the side parts to the base part and/or top part and/or wherein the rear wall is provided with the engagement elements, which engage in locations of the side parts close to the edge and/or of the top part and/or of the base part.

11. A constructional system as claimed in claim 9, wherein the locations are formed as bulges in a stamping and bending process.

12. A constructional system as claimed in claim 9, wherein the engagement elements are formed by stamped out material in an upper and lower edging zone of the side parts and/or by stamped out material and folding of the edging zones of the rear wall and by finger-like connection engaging in the locations.

13. A constructional system as claimed in claim 6, wherein the lug joints are designed to provide EMC screening.

14. A constructional system as claimed in claim 9, wherein the engagement elements are provided with contact elements, which function in conjunction with the locations.

15. A constructional system as claimed in claim 14, wherein the engagement elements extend beyond the locations after engagement and wherein the contact elements form at the same time engagement elements or locking elements of the lug joints.

16. A constructional system as claimed in claim 9, wherein the side edges are folded side edges having corner zones provided for stiffening by cross bracings, and wherein cutouts are provided for accommodating the cross bracings at upper and lower edging zones of the side parts next to the engagement elements.

17. A constructional system as claimed in claim 6, and further comprising third joint zones formed as formed threaded holes which function together with thread-forming screws.

18. A constructional system as claimed in claim 17, wherein the third joint zones are designed as approximately circular orifices and form a start engagement zone for a thread-forming screw premanufactured in a flat material.

19. A constructional system as claimed in claim 17, wherein the formed threaded holes serve for attachment of facia plates.

20. A constructional system as claimed in claim 8, wherein each of the locking devices features at least one locking latch at the rear wall which, after movement, engages in at least one locking catch formed in a region of the side parts and/or the base part and/or the top part.

21. A constructional system as claimed in claim 20, wherein each of the locking devices features a locking plate, on which at least one locking latch is formed, and wherein the locking plate is guided by a bolt retainer and is movable in a direction of a respective adjacent panel part.

22. A constructional system as claimed in claim 21, wherein a knurled screw on the locking plate is formed as a bolt retainer, is guided in a cutout of the rear wall and is operable from outside, and wherein the cutout runs at right angles in the rear wall, whereby at least one locking latch of the locking plate engages behind at least one locking catch of the adjacent panel part after horizontal and vertical movement.

23. A constructional system as claimed in claim 22, wherein the bolt retainer is formed as a gripping element for holding the rear wall.

24. A constructional system as claimed in claim 7, wherein an approximately "L" shaped fixing flange can be fixed to the side parts with the screw connections, and wherein a casing-like construction is provided on the top part, which is formed from a made-to-measure flat material section and can be fixed by self-cutting thread-forming screws to threads.

* * * * *